(12) United States Patent
Kong et al.

(10) Patent No.: US 11,751,492 B2
(45) Date of Patent: Sep. 5, 2023

(54) EMBEDDED MEMORY PILLAR

(71) Applicant: INTERNATIONAL BUSINESS MACHINES CORPORATION, Armonk, NY (US)

(72) Inventors: Dexin Kong, Redmond, WA (US); Ashim Dutta, Clifton Park, NY (US); Ekmini Anuja De Silva, Slingerlands, NY (US); Daniel Schmidt, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 210 days.

(21) Appl. No.: 17/484,649

(22) Filed: Sep. 24, 2021

(65) Prior Publication Data
US 2023/0099303 A1 Mar. 30, 2023

(51) Int. Cl.
| | |
|---|---|
| *G11C 13/00* | (2006.01) |
| *H10N 70/00* | (2023.01) |
| *H10B 61/00* | (2023.01) |
| *H10B 63/00* | (2023.01) |
| *H10N 50/01* | (2023.01) |
| *H10N 50/10* | (2023.01) |
| *H10N 50/80* | (2023.01) |
| *H10N 50/85* | (2023.01) |

(52) U.S. Cl.
CPC ........ *H10N 70/068* (2023.02); *H10B 61/00* (2023.02); *H10B 63/80* (2023.02); *H10N 50/01* (2023.02); *H10N 50/10* (2023.02); *H10N 50/80* (2023.02); *H10N 50/85* (2023.02); *H10N 70/023* (2023.02); *H10N 70/063* (2023.02); *H10N 70/066* (2023.02); *H10N 70/841* (2023.02)

(58) Field of Classification Search
None
See application file for complete search history.

(56) References Cited

U.S. PATENT DOCUMENTS

| | | | |
|---|---|---|---|
| 7,332,767 B2 | 2/2008 | Wang et al. | |
| 7,514,271 B2 | 4/2009 | Gaidis et al. | |
| 7,825,398 B2 | 11/2010 | Happ et al. | |
| 7,955,981 B2 | 6/2011 | Chen et al. | |
| 9,029,827 B2 | 5/2015 | Vereen et al. | |
| 9,515,252 B1 * | 12/2016 | Annunziata | ........... H10N 50/10 |
| 9,812,638 B2 | 11/2017 | Bethune et al. | |

(Continued)

FOREIGN PATENT DOCUMENTS

| | | |
|---|---|---|
| WO | 2005123373 A2 | 12/2005 |
| WO | 2021041735 A1 | 3/2021 |

OTHER PUBLICATIONS

Tamer Dogan, "Nano-Structured Hybrid Organic/Inorganic Electronic Devices", vol. 55. May 2019, pp. 1-116.

*Primary Examiner* — Tan T. Nguyen
(74) *Attorney, Agent, or Firm* — Tutunjian & Bitetto, P.C.; Samuel Waldbaum

(57) ABSTRACT

A memory device is provided. The memory device includes a memory stack on a first dielectric layer, and a sidewall spacer on the memory stack. The memory device further includes a conductive cap on the sidewall spacer and the memory stack and an upper metal line on the conductive cap and the sidewall spacer, wherein the upper metal line wraps around the conductive cap, sidewall spacer, and memory stack.

20 Claims, 6 Drawing Sheets

(56) References Cited

U.S. PATENT DOCUMENTS

| | | |
|---|---|---|
| 10,056,266 B2 | 8/2018 | Dieny et al. |
| 10,600,802 B2 | 3/2020 | Nakamura et al. |
| 10,833,096 B2 | 11/2020 | Tanaka et al. |
| 2008/0247219 A1 | 10/2008 | Choi et al. |
| 2010/0181649 A1* | 7/2010 | Lung ................ H10B 63/32 |
| | | 438/366 |
| 2023/0060906 A1* | 3/2023 | Xie ................ H10N 50/80 |

* cited by examiner

EMBEDDED MEMORY PILLAR

BACKGROUND

The present invention generally relates to embedded memory elements, and more particularly to a top contact for embedded memory elements.

Non-volatile memory (NVM) or non-volatile storage (NVS) is a type of computer memory that can retain stored information even after power is removed. Magnetoresistive random access memory (MRAM) stores data in magnetic storage elements called magnetic tunnel junctions (MTJs). Phase-change memory utilizes a reversible change of a material between a crystalline and an amorphous state or the co-ordination state of the material to store electronic data. These memory devices are electrically connected to other deices and metallization layers.

SUMMARY

In accordance with an embodiment of the present invention, a memory device is provided. The memory device includes a memory stack on a first dielectric layer, and a sidewall spacer on the memory stack. The memory device further includes a conductive cap on the sidewall spacer and the memory stack, and an upper metal line on the conductive cap and the sidewall spacer, wherein the upper metal line wraps around the conductive cap, sidewall spacer, and memory stack.

In accordance with another embodiment of the present invention, a memory device is provided. The memory device includes a lower memory electrode segment, a memory layer segment, and an upper memory electrode segment forming a memory stack on a first dielectric layer, and a sidewall spacer surrounding the memory stack. The memory device further includes a conductive cap on the sidewall spacer and the memory stack, and an upper metal line on the conductive cap and the sidewall spacer, wherein the sidewall spacer and conductive cap physically separates the upper metal line from the memory stack.

In accordance with yet another embodiment of the present invention, a method of forming a memory device is provided. The method includes forming a memory stack on a first dielectric layer, and forming a sidewall spacer on the memory stack. The method further includes forming a conductive cap on the sidewall spacer and the memory stack, and forming an upper metal line on the conductive cap and the sidewall spacer, wherein the upper metal line wraps around the conductive cap, sidewall spacer, and memory stack.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate to forming a conductive cap on the top of a memory pillar, where the conductive cap is wider than the memory pillar. In various embodiments, a metal-on-metal deposition can be used to form a conductive metal cap on the top metallic contact of a memory stack. The conductive cap can be a mushroom-shaped cap.

Embedding memory (MRAM, PCM, RRAM etc.) device in an advanced logic node is challenging because the separation between two metal lines is smaller than a minimum pillar height. This involves having a memory pillar protrude into the top metal line. This may not be achieved using conventional integration methods, since the top metal trench etch is may not be very selective to the memory pillar encapsulation dielectric.

In various embodiments, the wider conductive cap can reduce the risk of short between overlying metal line and a memory layer of the memory pillar. The conductive cap can cover the sidewall spacers encapsulating the memory stack, which can prevent over-etching of the sidewall spacers below the top of the memory layer section. In various embodiments, an etch-selective metal cap may be used to prevent spacer erosion, which allows the top metal line to wrap around the encapsulated memory stack.

Exemplary applications/uses to which the present invention can be applied include, but are not limited to: embedded memory application where memory will be embedded in the back-end interconnect layers of logic devices. Application of such memory could be as a stand-alone, non-volatile memory or a dynamic memory.

It is to be understood that aspects of the present invention will be described in terms of a given illustrative architecture; however, other architectures, structures, substrate materials and process features and steps can be varied within the scope of aspects of the present invention.

Figure 1:
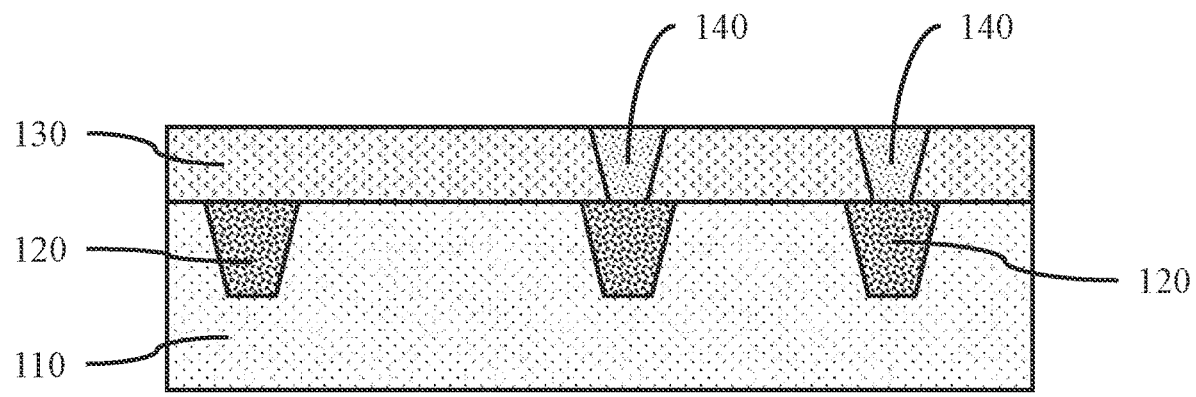
FIG. 1 is a cross-sectional side view showing a plurality of metal lines formed in a first dielectric layer, and conductive interconnects formed in a barrier layer on a subset of the metal lines, in accordance with an embodiment of the present invention.

Referring now to the drawings in which like numerals represent the same or similar elements and initially to FIG. 1, FIG. 1 is a cross-sectional side view showing a plurality of metal lines formed in a first dielectric layer, and conductive interconnects formed in a barrier layer on a subset of the metal lines, in accordance with an embodiment of the present invention.

In one or more embodiments, a plurality of metal lines 120 can be formed in a first dielectric layer 110, where the first dielectric layer 110 and metal lines 120 can be part of a metallization layer forming conductive interconnects to underlying devices on a substrate. The first dielectric layer could be formed on the substrate by a blanket deposition, for example, chemical vapor deposition (CVD), plasma enhanced CVD (PECVD), and combinations thereof.

In various embodiments, the first dielectric layer 110 can be made of an insulating, dielectric material, including, but not limited to, silicon oxide (SiO), silicon nitride (SiN), silicon oxynitride (SiON), silicon oxycarbide (SiOC), silicon boronitride (SiBN), silicon boro carbonitride (SiBCN), low-k dielectric materials, and combinations thereof. Low-k dielectric materials include dielectric materials having a dielectric constant less than silicon dioxide ($SiO_2$), for example, carbon doped silicon oxide (SiO:C), carbon doped oxide dielectrics materials (SiCOH), fluorine doped silicon oxide (SiO:F), spin-on-glasses, and combinations thereof.

In various embodiments, the metal lines 120 can include a plurality of layers including diffusion barrier layers, seed layers, and electromigration layers, where the metal lines 120 can be formed by a damascene-type process (e.g., dual damascene, etc.).

In various embodiments, the metal lines 120 can be a conductive material, including, but not limited to, a metal, for example, tungsten (W), copper (Cu), cobalt (Co), ruthenium (Ru), aluminum (Al), molybdenum (Mo), tantalum (Ta), titanium (Ti), platinum, (Pt), a metal compound, for example, tantalum carbide (TaC) titanium carbide (TiC), tantalum nitride (TaN), titanium nitride (TiN), tungsten nitride (WN), and combinations thereof.

In one or more embodiments, a barrier layer 130 can be formed on the top surface of the first dielectric layer 110 and the metal lines 120, where the barrier layer 130 can be formed by a conformal deposition, for example, atomic layer deposition (ALD), plasma enhanced ALD (PEALD), a blanket deposition, for example, chemical vapor deposition (CVD), plasma enhanced CVD (PECVD), and combinations thereof. The barrier layer 130 can be made of one or more diffusion barrier materials to prevent the out-diffusion of the material(s) forming the metal lines 120, where the barrier layer 130 may be a multilayer of barrier materials.

In various embodiments, the barrier layer 130 can be made of a diffusion barrier material, including, but not limited to, a dielectric barrier material, for example, silicon nitride (SiN), silicon carbonitride (SiCN), hydrogen doped silicon carbonitride (SiCNH), and combinations thereof.

In various embodiments, the barrier layer 130 can have a thickness in a range of about 50 nanometers (nm) to about 500 nm, or about 100 nm to about 250 nm, although other thicknesses are also contemplated. The barrier layer 130 can have a thickness sufficient to prevent diffusion of metal atoms from the metal lines 120 into overlying layers.

In one or more embodiments, one or more conductive interconnect(s) 140 can be formed in the barrier layer 130, where each of the conductive interconnect(s) 140 can be formed on a metal line 120, such that a subset of the metal lines 120 are in electrical contact with a conductive interconnect 140.

In various embodiments, the conductive interconnect(s) 140 can be a conductive material, including, but not limited to, a metal, for example, tungsten (W), copper (Cu), cobalt (Co), ruthenium (Ru), aluminum (Al), molybdenum (Mo), tantalum (Ta), titanium (Ti), platinum, (Pt), a metal compound, for example, tantalum carbide (TaC) titanium carbide (TiC), tantalum nitride (TaN), titanium nitride (TiN), tungsten nitride (WN), and combinations thereof. The conductive interconnect(s) 140 can be the same material as the metal lines 120, or the conductive interconnect(s) 140 can be a different material from the metal lines 120.

Figure 2:
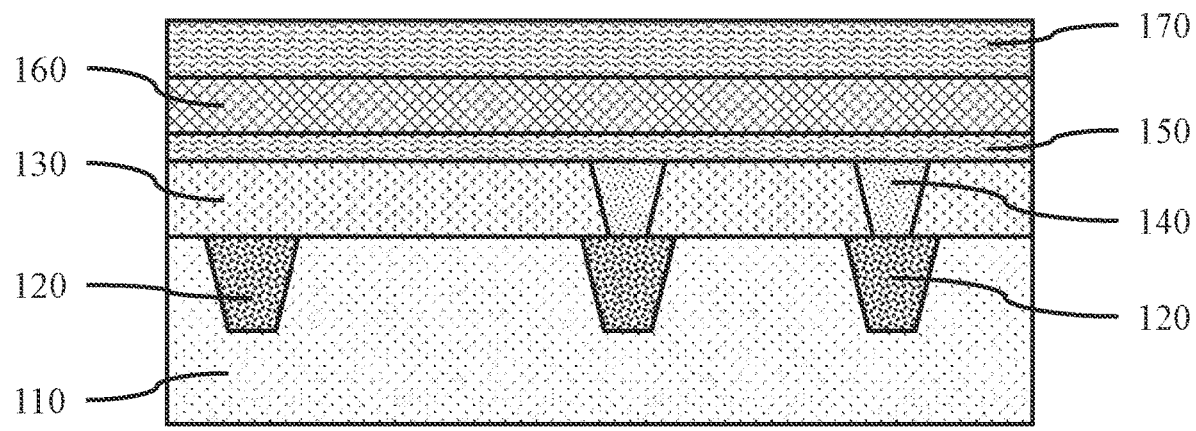
FIG. 2 is a cross-sectional side view showing a layer stack for forming a memory stack, including a lower memory electrode layer, a memory layer, and an upper memory electrode layer, formed on the barrier layer, in accordance with an embodiment of the present invention.

FIG. 2 is a cross-sectional side view showing a layer stack for forming a memory stack, including a lower memory electrode layer, a memory layer, and an upper memory electrode layer, formed on the barrier layer, in accordance with an embodiment of the present invention.

In one or more embodiments, a lower memory electrode layer 150 can be formed on the barrier layer 130 and conductive interconnect(s) 140, where the lower memory electrode layer 150 can be formed by a blanket deposition, for example, metal-organic CVD (MOCVD), physical vapor deposition (PVD), a conformal deposition, for example, ALD, PEALD, and combinations thereof.

In various embodiments, the lower memory electrode layer 150 can be a conductive material, including, but not limited to, cobalt (Co), aluminum (Al), ruthenium (Ru), tantalum nitride (TaN), titanium nitride (TiN), tungsten (W), and combinations thereof.

In various embodiments, the lower memory electrode layer 150 can have a thickness in a range of about 5 nanometers (nm) to about 100 nm, or about 10 nm to about 50 nm, although other thicknesses are also contemplated. The lower memory electrode layer 150 can have a thickness that is minimized to reduce the aspect ratio of the memory pillar.

In one or more embodiments, a memory layer 160 can be formed on the lower memory electrode layer 150, where the memory layer 160 can be a multilayer of memory materials that form a magnetic memory (MRAM), a phase change memory (PCM) a resistive memory (RRAM or ReRAM), a conductive bridge RAM (CBRAM), etc.

In one or more embodiments, a memory layer 160 can be a material, including, but not limited to, cobalt-iron-boron (CoFeB) for MRAM, germanium-antimony-tellurium (GST) for PCM, etc.

In various embodiments, the memory layer 160 can have a thickness in a range of about 5 nm to about 100 nm, or about 10 nm to about 50 nm, although other thicknesses are also contemplated. The memory layer 160 can have a thickness sufficient to store a memory state, where the thickness is determined by the intended functional characteristics or performance of the memory.

In one or more embodiments, an upper memory electrode layer 170 can be formed on the memory layer 160, where the upper memory electrode layer 170 can be formed by a blanket deposition, for example, metal-organic CVD (MOCVD), physical vapor deposition (PVD), PECVD, a conformal deposition, for example, ALD, PEALD, and combinations thereof.

In various embodiments, the upper memory electrode layer 170 can be a conductive material, including, but not limited to, tantalum nitride (TaN), titanium nitride (TiN), tungsten (W), cobalt (Co), ruthenium (Ru), aluminum (Al), and combinations thereof.

In various embodiments, the upper memory electrode layer 170 can have a thickness in a range of about 20 nm to about 200 nm, or about 50 nm to about 100 nm, although other thicknesses are also contemplated.

The upper memory electrode layer 170, memory layer 160, and lower memory electrode layer 150 can form a memory layer stack.

Figure 3:
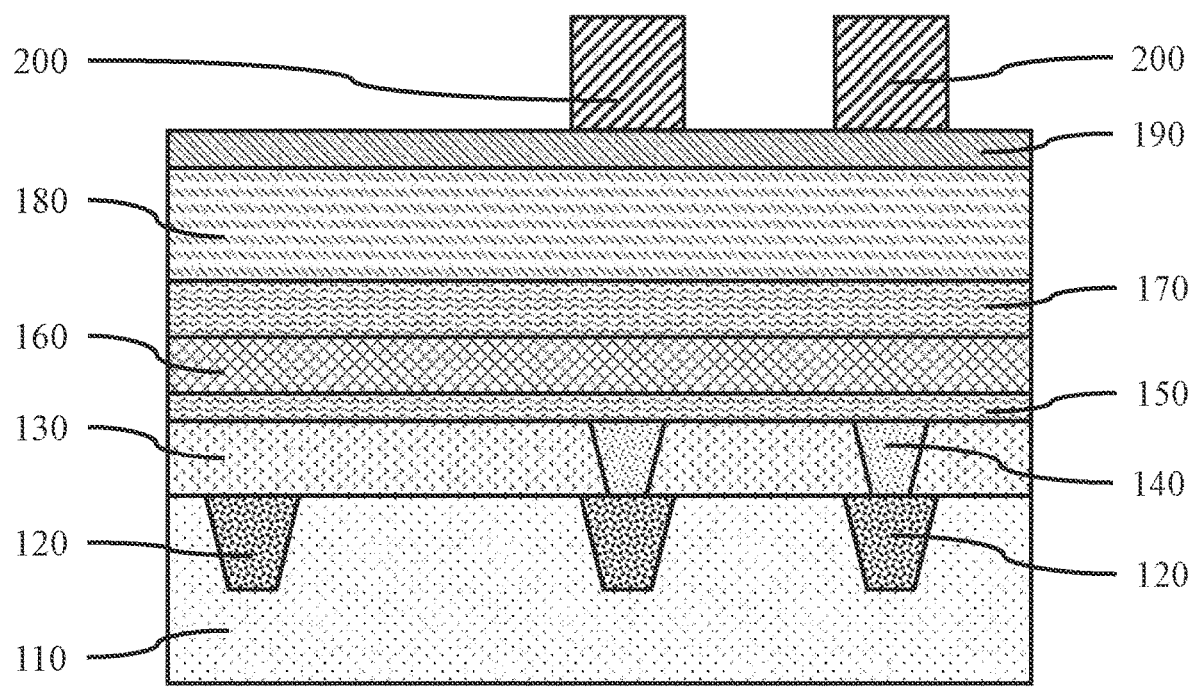
FIG. 3 is a cross-sectional side view showing a transfer layer formed on the upper memory electrode layer, a template layer formed on the transfer layer, and a resist template formed on the template layer, in accordance with an embodiment of the present invention.

FIG. 3 is a cross-sectional side view showing a transfer layer formed on the upper memory electrode layer, a template layer formed on the transfer layer, and a resist template formed on the template layer, in accordance with an embodiment of the present invention.

In one or more embodiments, a transfer layer 180 can be formed on the upper memory electrode layer 170, where the transfer layer 180 can be a lithographic layer and/or an optical planarization layer (OPL) that can be used to transfer a pattern/shape from a resist to the underlying memory layer stack. The transfer layer 180 can be formed by a blanket deposition (e.g., CVD), conformal deposition (e.g., ALD), spin-coating, and combinations thereof.

In one or more embodiments, a transfer layer 180 can be a material, including, but not limited to, OPL, amorphous carbon (a-C), and combinations thereof.

In one or more embodiments, a template layer 190 can be formed on the upper memory electrode layer 170, where the template layer 190 can be a hardmask layer that can be used to transfer a pattern/shape from a resist template to the underlying memory layer stack using, for example, a selective, directional etch, such as a reactive ion etch (RIE).

In one or more embodiments, a template layer 190 can be a hardmask material, including, but not limited to, a bottom Ant-reflection coating (BARC) above a low temperature oxide or SiON, a silicon doped anti-reflection coating (SiARC), etc.

In one or more embodiments, one or more resist templates 200 can be formed on the template layer 190 from a resist layer using lithographic processes and removal. The one or more resist templates 200 can be a polymeric resist material, a metal-containing resist material for deep ultraviolet (DUV) and extreme ultraviolet (EUV), and combinations thereof.

Figure 4:
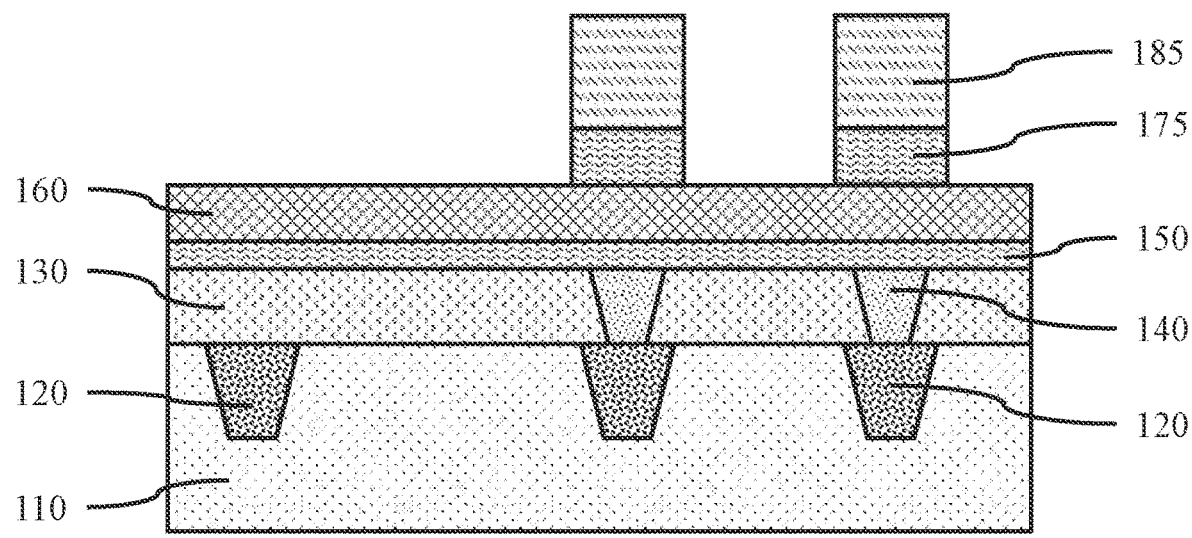
FIG. 4 is a cross-sectional side view showing the shape of the resist template transferred to the template layer, the transfer layer, and the upper memory electrode layer to form an upper memory electrode segment and a hardmask, in accordance with an embodiment of the present invention.

FIG. 4 is a cross-sectional side view showing the shape of the resist template transferred to the template layer, the transfer layer, and the upper memory electrode layer to form an upper memory electrode segment and a hardmask, in accordance with an embodiment of the present invention.

In one or more embodiments, a pattern of one or more resist templates 200 can be transferred to the underlying layers, including the template layer 190, transfer layer 180, and upper memory electrode layer 170, using one or more selective, direction, etch(es) (e.g., RIE) to form an upper memory electrode segment 175 for a memory stack. Removal of portions of the transfer layer 180 can form one or more transfer sections 185. The resist templates 200 and memory templates 195 can be completely removed in the process of forming the transfer sections 185 and upper memory electrode segment 175. In one or more embodiments, the transfer sections 185 can be completely removed by an $O_2$ or $N_2/H_2$ plasma based ashing process subsequent to forming the upper memory electrode segment 175.

Figure 5:
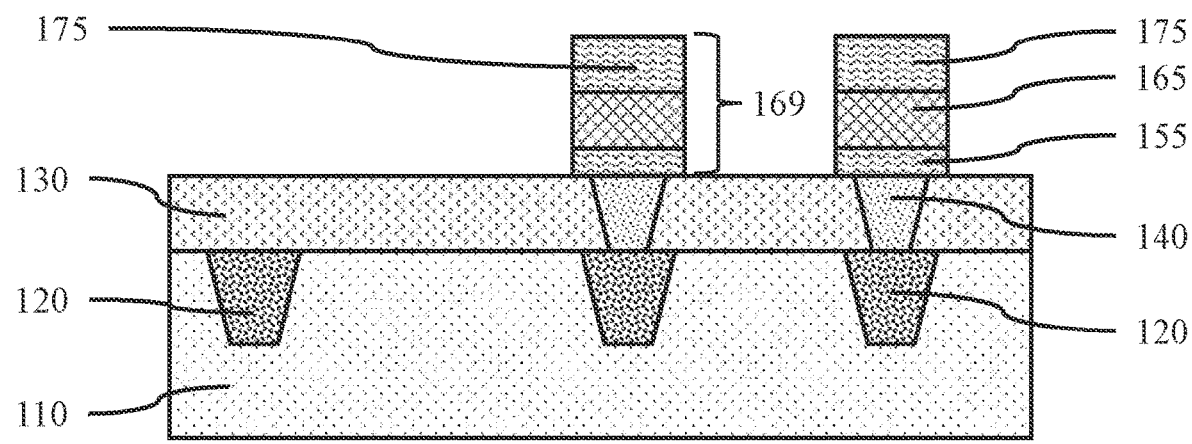
FIG. 5 is a cross-sectional side view showing removal of the resist template, a memory template, and a transfer section, and the top electrode template transferred to the memory layer, and the lower memory electrode layer of the memory stack, in accordance with an embodiment of the present invention.

FIG. 5 is a cross-sectional side view showing the shape of the upper memory electrode segment transferred to the memory layer and the lower memory electrode layer of the memory stack, in accordance with an embodiment of the present invention.

In one or more embodiments, the shape of the upper memory electrode segment 175 can be transferred to the memory layer 160 and the lower memory electrode layer 150, where the shape can be transferred using selective, directional etching (e.g., RIE). A part of the upper memory electrode segment 175 may be removed during the process of pattern transfer to form the memory layer segment 165 and the lower memory electrode segment 155, thereby reducing the height (thickness) of the upper memory electrode segment 175. The upper memory electrode segment 175, memory layer segment 165, and lower memory electrode segment 155 can form a memory stack 169. Each of one or more memory stacks 169 can be positioned on a separate conductive interconnect 140 and a portion of the barrier layer 130. The memory stack can be a non-volatile memory device.

In various embodiments, the memory stacks 169 can be circular in shape and have a critical dimension (CD) of about 10 nm to about 500 nm, or about 50 nm to about 250 nm, although other CDs are also contemplated. The memory stack 169 critical dimension (CD) can be greater than or equal to the top CD of the conductive interconnect 140, where the conductive interconnect 140 may be circular in shape.

Figure 6:
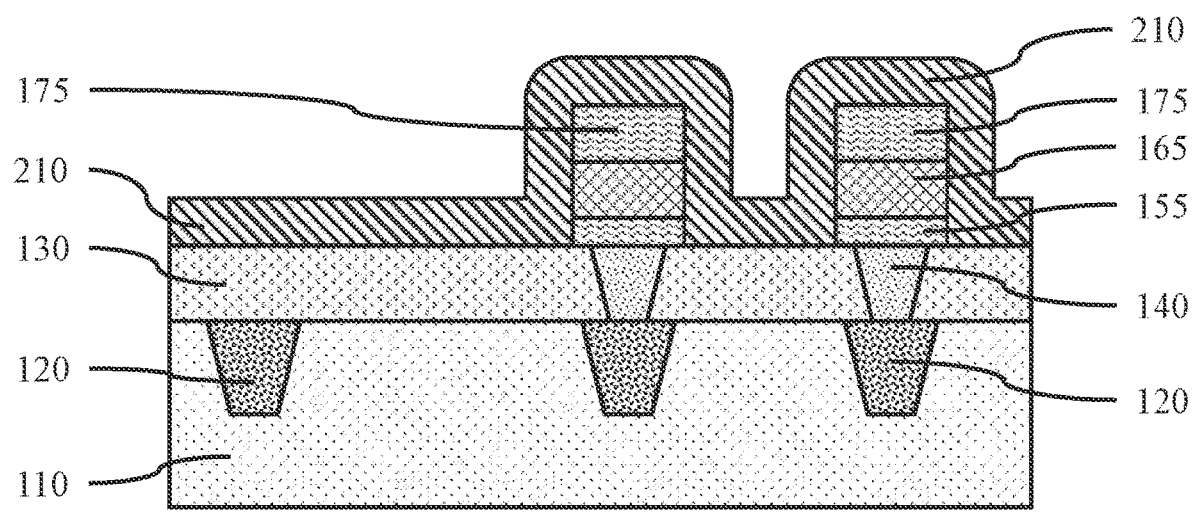
FIG. 6 is a cross-sectional side view showing formation of an encapsulation layer on the memory stack and barrier layer, in accordance with an embodiment of the present invention.

FIG. 6 is a cross-sectional side view showing formation of an encapsulation layer on the memory stack and barrier layer, in accordance with an embodiment of the present invention.

In one or more embodiments, an encapsulation layer 210 can be formed on the memory stack 169 and barrier layer 130, where the encapsulation layer 210 can be formed by CVD, PECVD, PVD, a conformal deposition (e.g., ALD, PEALD), and combinations thereof. The encapsulation layer 210 can surround the layers of the memory stack 169.

In various embodiments, the encapsulation layer 210 can be a protective, etch-stop layer, where the encapsulation layer 210 can be made of an insulating dielectric material, including, but not limited to, silicon oxide (SiO), silicon nitride (SiN), silicon oxynitride (SiON), silicon carbide (SiC), silicon oxycarbide (SiOC), silicon carbonitride (SiCN), hydrogen doped SiCN (SiCNH), silicon boronitride (SiBN), silicon boro carbonitride (SiBCN), silicon oxycarbo boronitride (SiOCBN), and combinations thereof. The encapsulation layer 210 can be a material that protects the underlying layers during subsequent etching and processing, while not being leaky.

In various embodiments, the encapsulation layer 210 can have a thickness in a range of about 20 nanometers (nm) to about 500 nm, or about 50 nm to about 250 nm, although other thicknesses are also contemplated. The encapsulation layer 210 can have a thickness sufficient to protect the underlying layers during subsequent processing.

Figure 7:
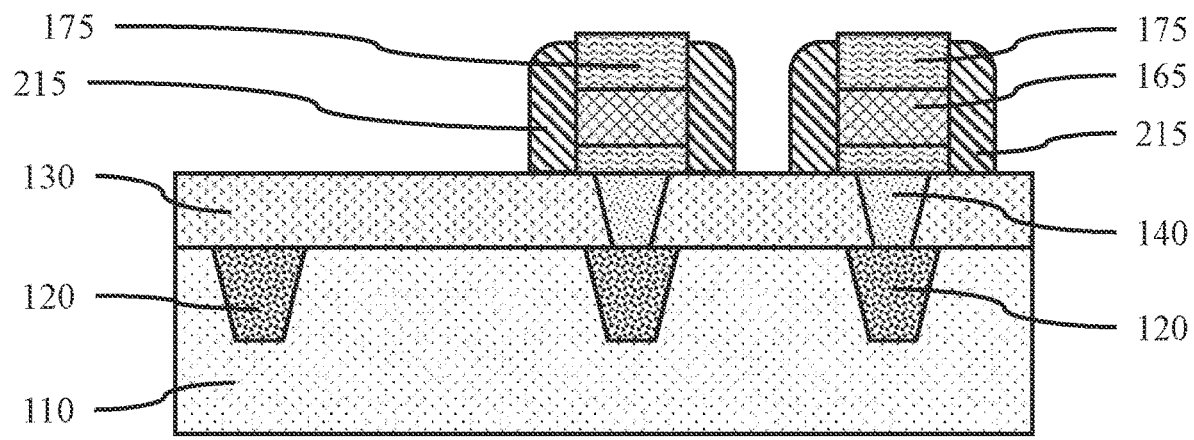
FIG. 7 is a cross-sectional side view showing patterning of the encapsulation layer to form sidewall spacers on the memory stack and barrier layer, in accordance with an embodiment of the present invention.

FIG. 7 is a cross-sectional side view showing patterning of the encapsulation layer to form sidewall spacers on the memory stack and barrier layer, in accordance with an embodiment of the present invention.

In one or more embodiments, portions of the encapsulation layer 210 can be removed by a selective, directional etch (e.g., RIE) to form sidewall spacer(s) 215 on the memory stack 169. In various embodiments, a single, continuous sidewall spacer can surround the memory stack 169. In various embodiments, the sidewall spacer(s) may be discontinuous, such that two or more sidewall spacers are around the sides of the memory stack 169. The top of the sidewall spacer(s) 215 can be below the top surface of the upper memory electrode segment 175 after the encapsulation layer 210 has been etched back. In various embodiments, portions of the barrier layer 130 between the sidewall spacers 215 can be exposed.

Figure 8:
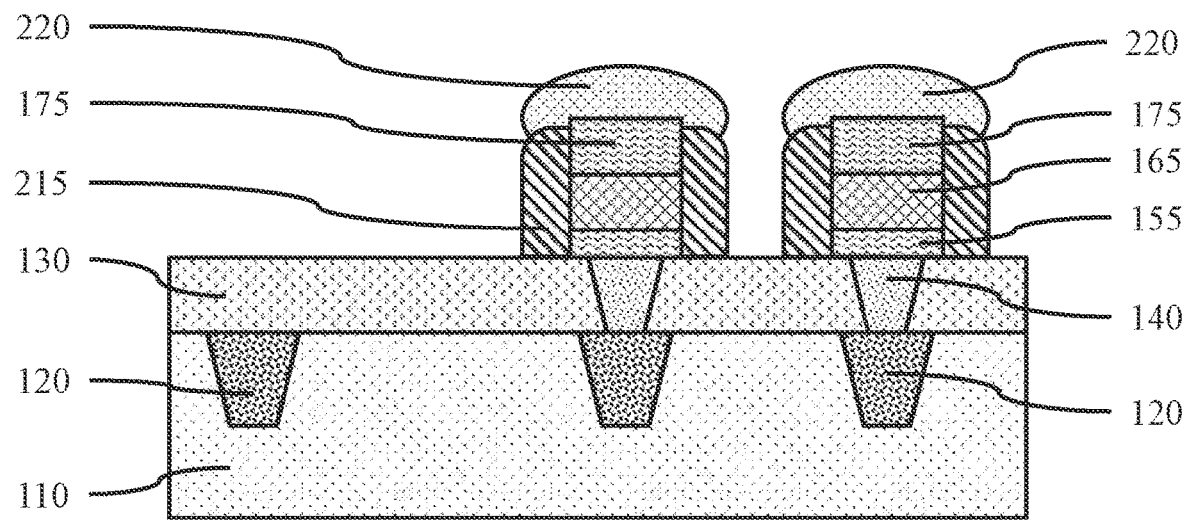
FIG. 8 is a cross-sectional side view showing formation of a conductive cap on the upper memory electrode segment of each of the memory stacks and the adjoining sidewall spacers, in accordance with an embodiment of the present invention.

FIG. 8 is a cross-sectional side view showing formation of a conductive cap on the upper memory electrode segment of each of the memory stacks and the adjoining sidewall spacers, in accordance with an embodiment of the present invention.

In one or more embodiments, a conductive cap 220 can be formed on the upper memory electrode segment 175 of each of the memory stacks 169 and the adjoining sidewall spacers 215, where the conductive caps 220 can be formed by a selective metal deposition. The selective metal deposition can deposit a metal on a particular material selectively, while avoiding deposition on the exposed surfaces of other materials forming the device components.

In various embodiments, the conductive cap 220 can form a mushroom-shaped cap on the upper memory electrode segment 175 that extends over at least a portion of the adjoining sidewall spacers 215. The conductive cap 220 can cover the adjoining sidewall spacers 215 to provide protection during patterning of a subsequently formed cover layer. In various embodiments, the conductive cap 220 is wider than the combined width of the sidewall spacer 215 and memory stack 169, so the entire sidewall spacer 215 and memory stack 169 is underneath the conductive cap 220 when viewed from above.

In various embodiments, the conductive cap 220 can be a metal, for example, tungsten (W), cobalt (Co), ruthenium (Ru), aluminum (Al), a metal compound, for example, tantalum carbide (TaC), tantalum nitride (TaN), titanium carbide (TiC), titanium nitride (TiN), and combinations thereof.

In various embodiments, the conductive cap 220 can have a thickness in a range of about 10 nanometers (nm) to about 100 nm, or about 25 nm to about 75 nm, although other thicknesses are also contemplated. The conductive cap 220 can have a thickness sufficient to prevent etching of the sidewall spacers 215 during subsequent directional etching processes (e.g., RIE). The conductive cap 220 can be used to prevent erosion of the sidewall spacers 215, thereby allowing an upper metal line to wrap around the memory stacks 169 and sidewall spacers 215 without electrically shorting to the upper memory electrode segment 175, memory layer segment 165, and/or lower memory electrode segment 155.

Figure 9:
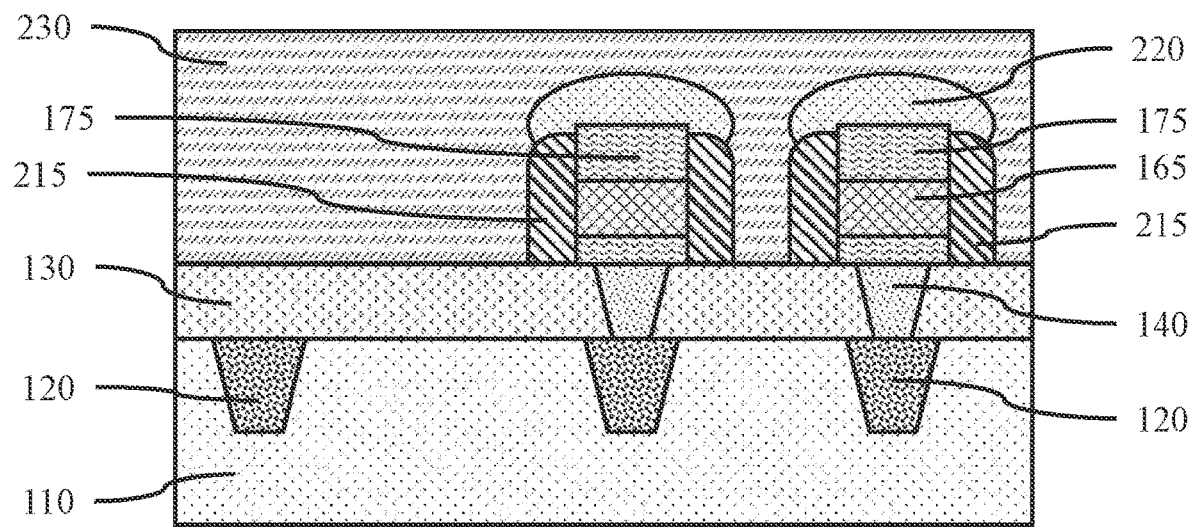
FIG. 9 is a cross-sectional side view showing formation of a cover layer on the conductive caps, memory stacks, sidewall spacers, and barrier layer, in accordance with an embodiment of the present invention.

FIG. 9 is a cross-sectional side view showing formation of a cover layer on the conductive caps, memory stacks, sidewall spacers, and barrier layer, in accordance with an embodiment of the present invention.

In one or more embodiments, a cover layer 230 can be formed on the conductive caps 220, memory stacks 169, sidewall spacers 215, and barrier layer 130, where the cover layer 230 can be formed by a blanket deposition (e.g., CVD, PECVD).

In various embodiments, the cover layer 230 can be an insulating, dielectric material, including, but not limited to, silicon oxide (SiO), silicon oxynitride (SiON), a low-k dielectric material, and combinations thereof. A low-k material can have a dielectric constant of less that silicon dioxide ($SiO_2$), for example, fluorine doped silicon oxide (SiO:F), carbon doped silicon oxide (SiO:C), a spin-on glass, SiOCH, and combinations thereof.

Figure 10:
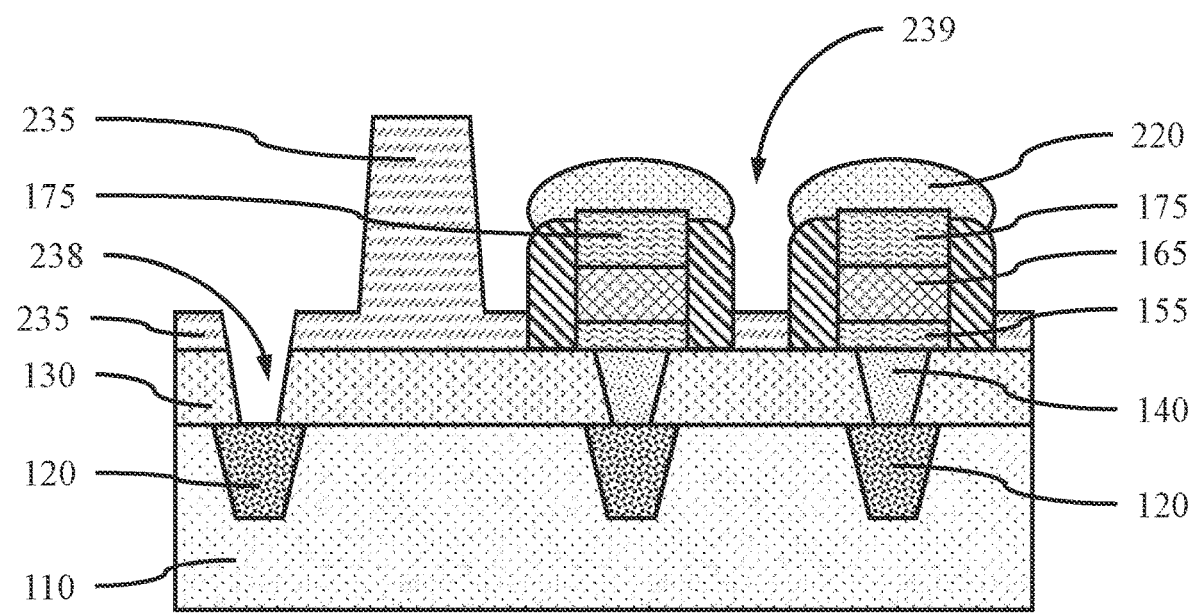
FIG. 10 is a cross-sectional side view showing patterning of the cover layer to form a via opening and a metal line trench, in accordance with an embodiment of the present invention.

FIG. 10 is a cross-sectional side view showing patterning of the cover layer to form a via opening and a metal line trench, in accordance with an embodiment of the present invention.

In one or more embodiments, the cover layer 230 can be patterned and etched to form one or more via openings 238 and metal line trenches 239, where the via openings 238 and metal line trenches 239 can be formed using a lithographic process and etching. The metal line trench(es) 239 can expose one or more conductive caps 220 and sidewall spacers 215. A patterned cover layer 235 can remain on the barrier layer 130, where a thickness of the patterned cover layer 235 an be on all or at least a portion of the barrier layer.

Figure 11:
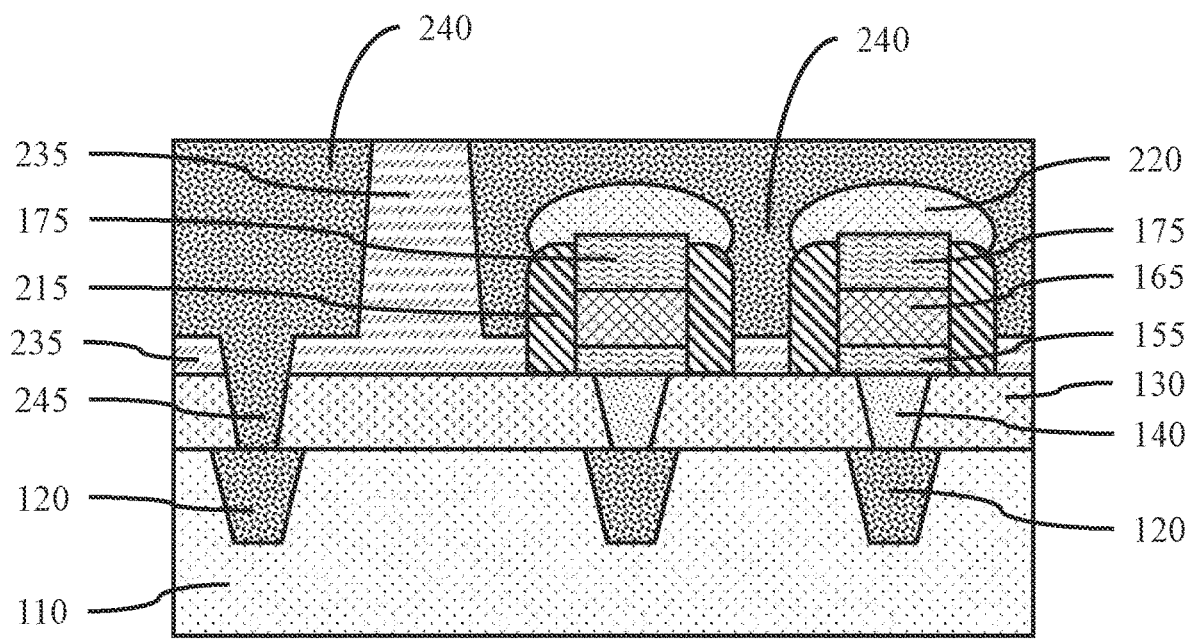
FIG. 11 is a cross-sectional side view showing formation of a conductive fill on the patterned cover layer to form a conductive via and an upper metal line, in accordance with an embodiment of the present invention.

FIG. 11 is a cross-sectional side view showing formation of a conductive fill on the patterned cover layer to form a conductive via and an upper metal line, in accordance with an embodiment of the present invention.

In one or more embodiments, a conductive fill can be formed on the patterned cover layer 235 and in via openings 238 to form a conductive via 245 and an upper metal line 240, where the conductive fill can be formed by a blanker deposition, e.g., MOCVD, PVD, CVD, PECVD, electroplating, etc.).

In various embodiments, the bottom of a metal line 240 can extend below the plane of the top surface of the lower memory electrode segment 155, and may extend down to the top surface of the cap layer 130. This could result in the length (height) of a conductive via 245 being less than or equal to the height of a bottom electrode contact 140.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A memory device, comprising:
a memory stack on a first dielectric layer;
a sidewall spacer on the memory stack;
a conductive cap on the sidewall spacer and the memory stack; and
an upper metal line on the conductive cap and the sidewall spacer, wherein the upper metal line wraps around the conductive cap, sidewall spacer, and memory stack.

2. The memory device of claim 1, wherein the conductive cap is wider than a combined width of the sidewall spacer and memory stack.

3. The memory device of claim 1, wherein the conductive cap is a metal selected from the group consisting of tungsten (W), cobalt (Co), ruthenium (Ru), and combinations thereof.

4. The memory device of claim 1, wherein the sidewall spacer has a thickness in a range of about 20 nanometers (nm) to about 500 nm.

5. The memory device of claim 1, further comprising a barrier layer between the memory stack and the first dielectric layer.

6. The memory device of claim 5, further comprising a lower metal line in the first dielectric layer, wherein the lower metal line is in electrical communication with the memory stack.

7. The memory device of claim 6, wherein the memory stack includes a lower memory electrode segment, a memory layer segment, and an upper memory electrode segment.

8. The memory device of claim 7, further comprising a patterned cover layer on the barrier layer.

9. A memory device, comprising:
   a lower memory electrode segment, a memory layer segment, and an upper memory electrode segment forming a memory stack on a first dielectric layer;
   a sidewall spacer surrounding the memory stack;
   a conductive cap on the sidewall spacer and the memory stack; and
   an upper metal line on the conductive cap and the sidewall spacer, wherein the sidewall spacer and conductive cap physically separates the upper metal line from the memory stack.

10. The memory device of claim 9, further comprising a barrier layer between the memory stack and the first dielectric layer.

11. The memory device of claim 10, further comprising a patterned cover layer on the barrier layer.

12. The memory device of claim 11, wherein the sidewall spacer is an insulating dielectric material selected from the group consisting of silicon oxide (SiO), silicon nitride (SiN), silicon oxynitride (SiON), silicon carbide (SiC), silicon oxycarbide (SiOC), silicon carbonitride (SiCN), hydrogen doped SiCN (SiCNH), silicon boronitride (SiBN), silicon boro carbonitride (SiBCN), silicon oxycarbo boronitride (SiOCBN), and combinations thereof.

13. The memory device of claim 12, wherein the conductive cap is a metal selected from the group consisting of tungsten (W), cobalt (Co), ruthenium (Ru), and combinations thereof.

14. A method of forming a memory device, comprising:
   forming a memory stack on a first dielectric layer;
   forming a sidewall spacer on the memory stack;
   forming a conductive cap on the sidewall spacer and the memory stack; and
   forming an upper metal line on the conductive cap and the sidewall spacer, wherein the upper metal line wraps around the conductive cap, sidewall spacer, and memory stack.

15. The method of claim 14, wherein the conductive cap is a metal selected from the group consisting of tungsten (W), cobalt (Co), ruthenium (Ru), and combinations thereof.

16. The method of claim 14, wherein the memory stack is a non-volatile memory device selected from the group consisting of a magnetic memory (MRAM), a phase change memory (PCM) a resistive memory (RRAM or ReRAM), and a conductive bridge RAM (CBRAM).

17. The method of claim 14, further comprising forming a barrier layer on the first dielectric layer before forming the memory stack and the sidewall spacer.

18. The method of claim 17, further comprising forming a patterned cover layer on the barrier layer and the sidewall spacer.

19. The method of claim 18, further comprising forming a conductive fill on the patterned cover layer to form the upper metal line.

20. The method of claim 19, wherein the conductive fill is in physical contact with the barrier layer.

* * * * *